United States Patent [19]
Gillette et al.

[11] Patent Number: 5,742,484
[45] Date of Patent: Apr. 21, 1998

[54] FLEXIBLE CONNECTOR FOR CIRCUIT BOARDS

[75] Inventors: Joseph G. Gillette, Margate; Scott G. Potter, Coconut Creek; Pradeep Lall, Sunrise, all of Fla.

[73] Assignee: Motorola, Inc., Schaumburg, Ill.

[21] Appl. No.: 801,612

[22] Filed: Feb. 18, 1997

[51] Int. Cl.$^6$ ........................................ H05K 1/14
[52] U.S. Cl. .................. 361/789; 361/784; 361/826; 361/827; 361/776; 361/777; 439/77; 439/83; 439/85; 439/591; 439/592; 439/586; 174/117 F; 174/117 FF; 174/261; 174/268; 174/106 R
[58] Field of Search ........................ 361/789, 803, 361/784, 826, 827, 767, 776, 777, 749; 439/77, 83, 85, 591, 592, 586; 174/99 R, 261, 268, 72 TR, 90, 106 R, 113 R, 117 F, 117 FF

[56] References Cited

U.S. PATENT DOCUMENTS

| | | | |
|---|---|---|---|
| 4,184,729 | 1/1980 | Parks et al. | 439/66 |
| 4,255,853 | 3/1981 | Campillo et al. | 29/843 |
| 4,385,341 | 5/1983 | Main | 361/767 |
| 4,870,308 | 9/1989 | Sismour, Jr. | 310/71 |
| 5,386,341 | 1/1995 | Olson et al. | 361/749 |

*Primary Examiner*—Michael W. Phillips
*Assistant Examiner*—David Foster
*Attorney, Agent, or Firm*—Dale W. Dorinski

[57] ABSTRACT

A surface mountable flexible interconnect (10) for connecting two circuit board (30, 32) consists of a flex circuit (12) with solderable runners (14) on one side, the runners traversing the flex circuit from one end to the other. There is a solderable pad (16) at the end of each runner, and each solderable pad has a solder bump (18) fused to it. A rigid carrier ring (20) is used to hold the flex circuit in position prior to placement on the PCB. The flex circuit is formed into a U-shaped loop (26), and the loop is aligned to the carrier so that the loop is situated in an aperture (24) in the carrier. The solder pads lie directly under the carrier ring and face away from it. An adhesive (22) bonds the flex circuit to the carrier ring.

19 Claims, 5 Drawing Sheets

5,742,484

FLEXIBLE CONNECTOR FOR CIRCUIT BOARDS

TECHNICAL FIELD

This invention relates to connectors for printed circuit boards, and more specifically, to a surface mountable flexible connector for printed circuit boards.

BACKGROUND

The challenge of making a low cost, reliable interconnection between two printed circuit boards has been with the electronics industry for as long as the printed wiring board has been in existence. The literature is replete with novel and interesting solutions to this problem. Unfortunately, the perfect interconnect has not been invented, and there is an unfilled need for a better solution to the interconnect problem.

Traditionally, the connection of closely stacked parallel printed circuit boards (PCB) has been achieved with rigid connectors. These are typically made of two mating halves, a male and a female, each having leads to attach to the PCB and receptacles captured in a rigid housing. One advantage of rigid connectors is that the various halves of the connectors are easily surface mountable and some degree of automation can be employed when they are attached to the PCB. However, they often require manual processes to mate the two PCBs to each other, and they are susceptible to mechanical failure due to stress induced by tolerance stackup or by mechanical shock from dropping onto a surface. Some have sought to overcome these problems by creating a flexible interconnect between the two PCBs. This is typically achieved by plugging a flexible circuit into a connector which is mounted on each PCB. While this solves the stress problem in the assembly, it still has a rigid connector on each PCB and requires additional parts. Further, flexible circuits don't lend themselves well to automated assembly. The advantages accrued by the flexibility of the film also work to one's disadvantage, because the flexibility of the film makes it hard to handle with robotics. The ongoing activity in the field of PCB interconnection is a testament to the importance and need for a robust, mechanically compliant, automatable interconnect system.

DETAILED DESCRIPTION OF THE PREFERRED EMBODIMENT

Figure 1:
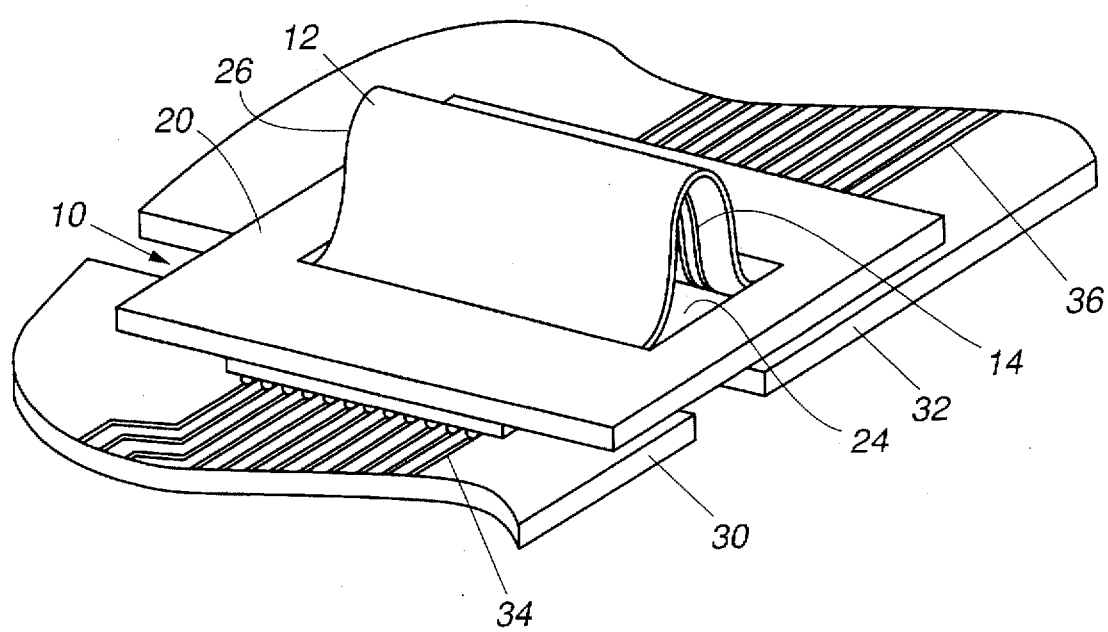
FIG. 1 is an isometric view of a flexible interconnect joining two PCBs in accordance with the invention.

A surface mountable flexible interconnect for connecting two circuit board consists of a flex circuit with solderable runners on one side, the runners traversing the flex circuit from one end to the other. There is a solderable pad at the end of each runner, and each solderable pad has a solder bump fused to it. A rigid carrier ring is used to hold the flex circuit in position prior to placement on the PCB. The flex circuit is formed into a U-shaped loop, and the loop is aligned to the carrier so that the loop is situated in an aperture in the carrier. The solder pads lie directly under the carrier ring and face away from it. An adhesive bonds the flex circuit to the carrier ring. While the specification concludes with claims defining the features of the invention that are regarded as novel, it is believed that the invention will be better understood from a consideration of the following description in conjunction with the drawing figures.

Figure 2:
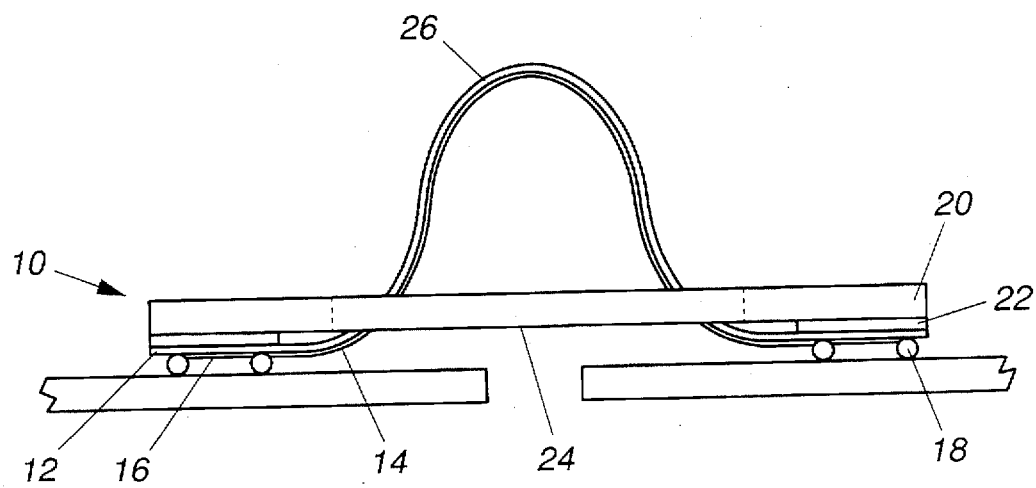
FIG. 2 is a side view of the flexible interconnect in accordance with the invention.
Figure 3:
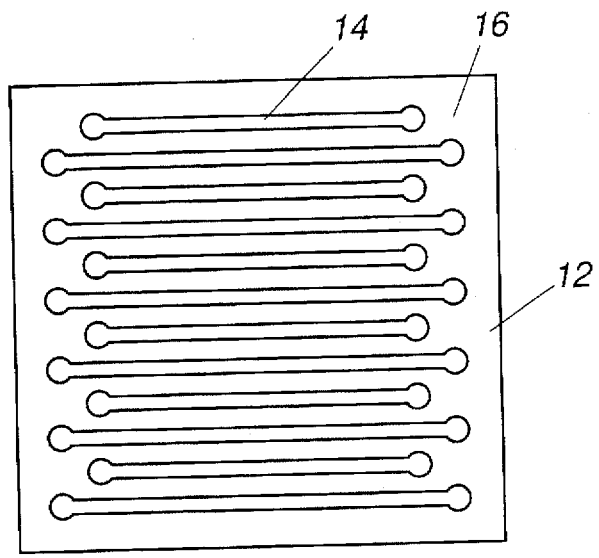
FIG. 3 is a bottom plan view of a flex circuit used in the flexible interconnect shown in FIGS. 1 and 2.

Referring now to FIGS. 1, 2 and 3, isometric, side, and bottom plan views of a preferred embodiment of the invention, the flexible, surface mountable PCB interconnect 10 consists of a flexible film 12 that serves as the heart of the interconnect. The flexible film is typically a polyester or polyimide film, from 0.5 to 10 mils in thickness, comparable to what is commonly used in the electronics industry for flexible circuitry. On one side of the flexible film 12 are a plurality of electrically conductive runners 14 that serve to electrically interconnect one PCB 30 to the other 32. In the preferred embodiment the runners are copper, (optionally plated with materials such as tin/lead alloys, nickel or gold) but other conductive materials such at aluminum, titanium, or graphite-based inks will also find favor. Titanium or aluminum are typically sputtered onto the flexible film, whereas the graphite based inks are typically screen printed. In practice, there are many conductive runners that traverse the film from one end to the other, and they typically run parallel to each other. Although the simplest and lowest cost version of the invention is a flexible film with circuitry on one side only, one can also utilize a film with circuitry on both sides, and with conductive through holes or vias connecting one side to the other.

Figure 9:
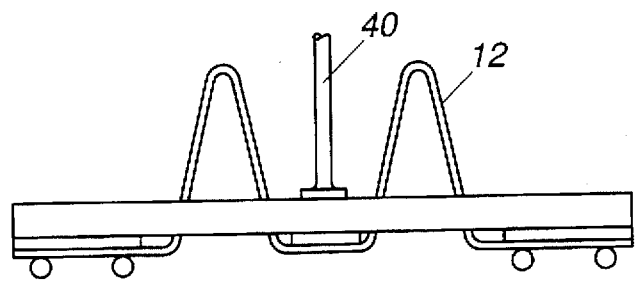
FIGS. 9–11 are side view of additional embodiments of the invention showing alternate configurations of the flexible member in relation to the rigid retainer.
Figure 10:
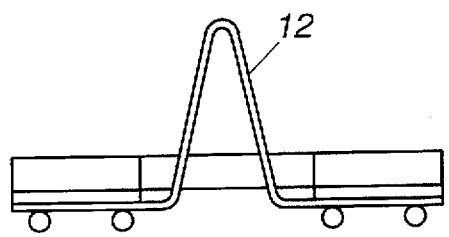
Figure 11:
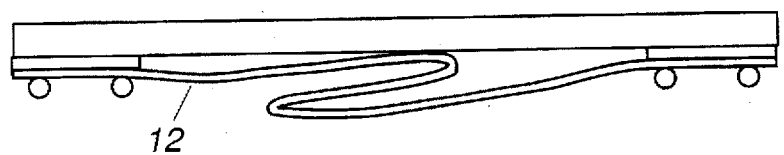

Typically, each end of the conductive runners 14 contains a solderable pad 16, and each solderable pad has an electrically conductive media such as a solder ball 18, a gold bump, or an electrically conductive adhesive adhered to it. The solder ball 18 is typically a sphere of eutectic solder that is fused to the solderable pad 16. The flexible film is then formed into a loop 26 that has the general shape of a "U". The purpose of the loop is to provide the length required to accommodate the PCB-to-PCB gap as well as to offer strain relief for the connection. Although FIGS. 1 & 2 depict the loop as generally having a U-shape, we know that other configurations are equally effective in various situations. For example, FIGS. 9, 10, and 11 depict the flexible film 12 formed in the shape of a W, in the shape of a V, and folded into the shape of an S, respectively. The loop also serves as a service loop so that after connecting the PCBs together, the PCBs can be manipulated in space to their final position, which may be different than their initial position during assembly. In the preferred embodiment, the solderable pads are located on the flexible film so that they form an array or partial array similar to that found on the popular ball grid array integrated circuit packages.

A rigid retainer member 20 is used to hold the flexible film 12 in a predetermined position. Prior art attempts to use flex circuits for board to board interconnects suffered from the tendency of the flexible film to move about. Our invention employs a rigid carrier ring 20 to hold the flexible film securely in position. Although we refer to element 20 as a "ring", the invention is by no means limited to a carrier having a circular shape. Indeed, the most common application finds a square or rectangular shape, and it is contemplated that other shapes that do not have a completely closed exterior can be used, for example, a "C" shaped carrier functions in a similar manner. In the preferred embodiment, the carrier ring is a laminated sheet, similar to that commonly used as printed circuit board material. Indeed, we have found that common epoxy-glass or polyimide glass circuit board laminate without the copper cladding functions well as a carrier. Other materials such as injection molded plastic or stamped metal can also be used with efficacy. In the center of the carrier ring is an aperture 24 that serves to capture the flexible film loop. The film is situated such that the loop 26 is in the aperture 24, and depending on the configuration and design of the connector, the loop may protrude out of the aperture, or it may simply be captured in the aperture. The flexible film is adhesively bonded to the carrier ring by applying an adhesive 22 to selective locations of the carrier and the film. Typically, the adhesive lies directly over the solderable pads and the solder bumps. This approach captures the ends of the flexible film so that the solder bumps are always maintained in a coplanar relationship, and so that the solder interconnect can be made in the well tested and reliable controlled collapse chip carrier connection (C5). In addition, the carrier ring also provides a flat, reproducible surface for use with the vacuum chucks commonly found on automated pick and place machines (see FIG. 9, element number 40). Thus, our novel interconnect can also be placed by robots and other types of automated machines in a highly reliable fashion, and significantly reduces the overall cost of the PCB-to-PCB interconnect. The use of the carrier ring now makes the flexible film behave much like any other surface mounted component, allowing its use in tape and reel format, bowl feeding, stick and tubes, or tray feeding.

Figure 4:
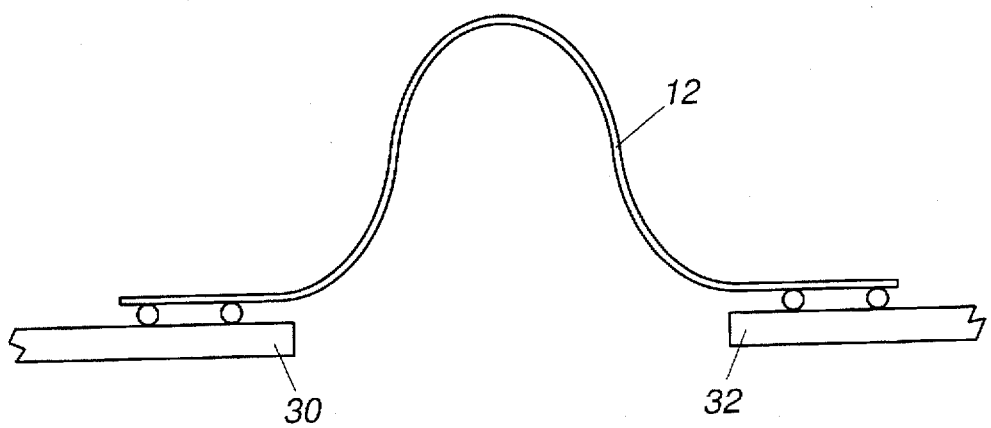
FIGS. 4 and 5 are side views of the flexible interconnect soldered to PCBs with the retaining ring removed.
Figure 5:
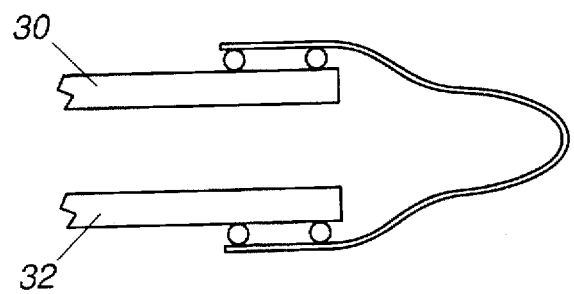

To use the interconnect, the two PCBs 30, 32 are positioned so that their top surfaces are coplanar and the respective interconnect pads 34, 36 are aligned to receive the solder bumps 18 on the flexible film. The interconnect is positioned on the PCBs, and soldered in place by passing through a reflow oven. Note that no special fixturing is needed to hold the PCBs and the interconnect in place, as is typically needed when soldering an unsupported film. FIG. 4 depicts the interconnect after soldering, when the carrier ring has been removed from the film 12, as it is no longer needed to hold the film steady. This is accomplished by heating the adhesive above its melt or softening point so that the adhesive releases its bond. FIG. 5 shows one of the many possible configurations of the interconnected PCBs 30, 32 repositioned in space relative to each other after the carrier had been removed.

Figure 6:
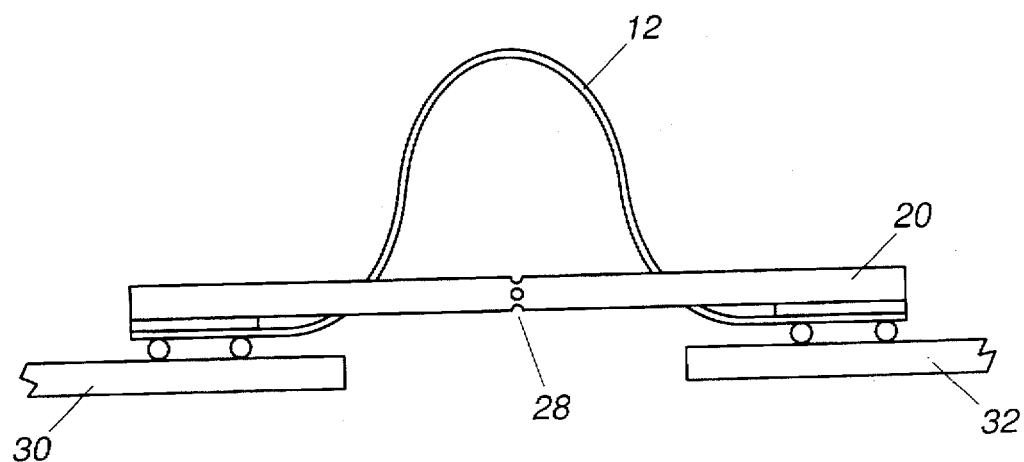
FIG. 6 is a side view of another embodiment of the invention showing a prescored retaining ring.
Figure 7:
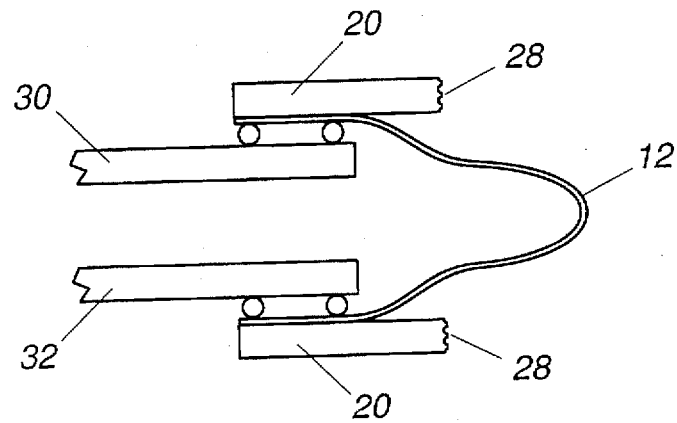
FIG. 7 is a side view of an alternate embodiment of the invention, showing the flexible interconnect after the retaining ring has been broken along a prescored line in accordance with the invention.

Depending on the application, one may employ a thermoplastic adhesive or a thermoset adhesive. In FIG. 6, one alternate embodiment of the invention finds a thermoset adhesive used to bond the flexible film 12 to the carrier ring 20, and instead of removing the carrier after soldering, the carrier is broken about a predetermined line 28 by flexing or bending it. In the case of a laminated PCB material used for the ring, a series of closely spaced holes are drilled in the laminate, or if the carrier is molded plastic, a thin section can be made. FIG. 7 shows the carrier after breaking along the pre-scored line, with the interconnected PCBs repositioned as desired. Although the carrier is broken on the score-line, it remains attached to the flex circuit.

Figure 8:
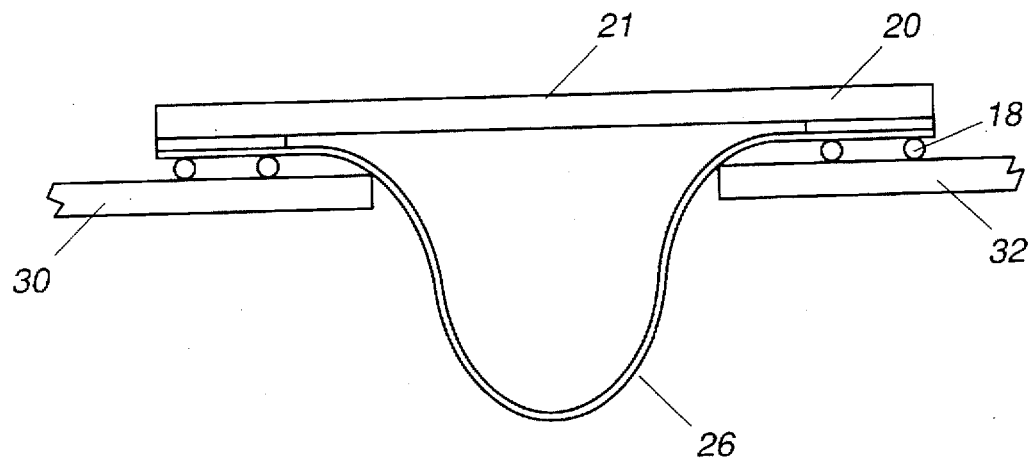
FIG. 8 is a side view showing the flexible interconnect joining two PCBs in an alternate embodiment of the invention.

Still another embodiment, shown in FIG. 8 has the loop protruding away from the carrier 20. In this case, rather than the loop facing up and away from the solder bumps 18, the loop is facing down and towards the solder bumps. This situation also lends itself quite well to use with auto assembly machines, as the entire top surface 21 of the carrier ring is available to be accessed by the vacuum pickup chuck.

Figure 12:
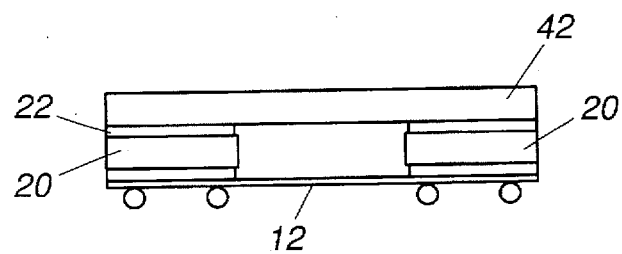
FIG. 12 is a side view of still another embodiment of the invention showing the loop protruding below the retaining member.

FIG. 12, is still another embodiment of our invention where an additional carrier member 47, is fastened to the top side of the rigid retaining members 20. In this case, the additional carrier member 42 serves as the rigidizing member, and the members 20 are mounted to the flexible film 12 by means of a permanent adhesive. A temporary adhesive is used to bond the additional carrier member 42 to the members 20, and the additional carrier member 42 is removed after soldering. This drawing figure also depicts a situation where the flexible film does not have a service loop, but is simply is a straight sheet. As not all configurations of interconnection require a service loop or strain relief, the flat sheet can also be used with some of the previously described configurations.

In summary, a novel surface mountable interconnect for PCBs has been created that satisfies a long felt need in the industry for a low cost, low profile, reliable, flexible surface mount board to board interconnect. While the preferred embodiments of the invention have been illustrated and described, it will be clear that the invention is not so limited, as alternate embodiments have been described herein. And other equivalents, such as a plurality of loops in the flexible film, will occur to those skilled in the art without departing from the spirit and scope of the present invention as defined by the appended claims.

What is claimed is:

1. A surface mountable flexible interconnect for connecting two circuit boards, comprising:
    a flexible film having first and second opposed major surfaces, and having a plurality of electrically conductive runners formed on the first major surface, each runner having a terminal portion at each end, and each terminal portion having an electrically conductive bump affixed thereto;
    a rigid member for retaining the flexible film, the rigid member having an aperture;
    a central portion of the flexible film formed into a loop, said loop disposed in the aperture; and
    perimeter portions of the flexible film adhesively bonded to the rigid member by means of an adhesive disposed between the rigid member and the second major surface.

2. The flexible interconnect as described in claim 1, wherein the electrically conductive bump is a solder bump.

3. The flexible interconnect as described in claim 1, wherein the flexible film is polyester or polyimide.

4. The flexible interconnect as described in claim 1, wherein the rigid member is a laminated sheet, injection molded plastic, of metal.

5. The flexible interconnect as described in claim 1, wherein the electrically conductive runners are copper or graphite-based conductive ink.

6. The flexible interconnect as described in claim 1, wherein the film is adhesively bonded to the rigid member by a thermoplastic adhesive.

7. The flexible interconnect as described in claim 1, wherein the film is adhesively bonded to the rigid member by a thermoset adhesive.

8. The flexible interconnect as described in claim 1, wherein the rigid member has a pre-scored break point that will allow the interconnect to bend when the break point is broken.

9. The flexible interconnect as described in claim 1, wherein the loop is formed into the shape of a U, a V, a W or an S.

10. A surface mountable flexible interconnect for connecting two circuit boards, comprising:
   a flex circuit having circuit runners on a first side, the runners traversing the flex circuit from one end to the other and having a solderable pad at each end, each solderable pad having a solder bump fused thereto;
   a rigid retaining ring having a perimeter portion surrounding a centrally located aperture;
   the flex circuit formed into a U-shaped loop;
   the flex circuit and the retaining ring aligned to each other so that the loop is situated in the aperture and the solder bumps lie directly under the perimeter portion and face away from the retaining ring; and
   an adhesive bonding those portions of a second side of the flex circuit that lie directly above the solder bumps to the perimeter portion of the retaining ring.

11. The flexible interconnect as described in claim 10, wherein the retaining ring is a laminated sheet.

12. The flexible interconnect as described in claim 10, wherein the retaining ring is molded plastic.

13. The flexible interconnect as described in claim 10, wherein the retaining ring has a pre-scored break point that will allow the interconnect to bend when the break point is broken.

14. A surface mountable flexible interconnect for connecting two circuit boards, comprising:
   a flexible film having first and second opposed major surfaces, and having a plurality of electrically conductive runners formed on the first major surface, each runner having a terminal portion, with a solder bump affixed thereto;
   a rigid member for retaining the flexible film;
   a central portion of the flexible film formed into a U-shaped loop;
   the flexible film situated with respect to the rigid member so that the U-shaped loop protrudes away from the rigid member, other portions of the flexible film bonded to the rigid member by means of an adhesive disposed between the rigid member and portions of the second major surface that overlie the terminal portions.

15. A surface mountable flexible interconnect system, comprising:
   first and second circuit boards, each having a plurality of interconnect pads;
   a surface mountable flexible interconnect soldered to the plurality of solder pads, said flexible interconnect comprising:
      a flex circuit having conductive runners on a first side, the runners traversing the flex circuit from one end to the other and having a solderable pad at each end, each solderable pad having a solder bump fused thereto for soldering to the interconnect pads;
      a rigid retaining ring having a perimeter portion surrounding a centrally located aperture;
      the flex circuit formed into a U-shaped loop;
      the flex circuit and the retaining ring aligned to each other so that the loop is situated in the aperture and the solder pads lie directly under the perimeter portion and face away from the retaining ring; and
      an adhesive bonding those portions of a second side of the flex circuit that lie directly above the solder bumps to the perimeter portion of the retaining ring; and
   wherein the rigid retaining ring is removed after the flexible interconnect is soldered to the first and second circuit boards.

16. A surface mountable flexible interconnect, comprising:
   a flex circuit having circuit runners on one side, the runners traversing the flex circuit from one end to the other and having a solderable pad at each end, each solderable pad having a solder bump fused thereto;
   a rigid retaining member; and
   the flex circuit and the retaining ring aligned to each other so that the flex circuit is adhered to a bottom side of the rigid retaining member by an adhesive, and the solder bumps face away from the rigid retaining member.

17. The surface mountable flexible interconnect as described in claim 16, wherein a center portion of the flex circuit is folded into an S-shape.

18. The surface mountable flexible interconnect as described in claim 16, further comprising an additional rigid member adhered to a top side of the rigid retaining member.

19. The surface mountable flexible interconnect as described in claim 16, wherein the rigid retaining member serves as a pickup point for a vacuum pickup tool.

* * * * *